(12) United States Patent
Ishikawa

(10) Patent No.: US 10,650,878 B2
(45) Date of Patent: *May 12, 2020

(54) APPARATUSES AND METHODS FOR REFRESH CONTROL

(71) Applicant: MICRON TECHNOLOGY, INC., Boise, ID (US)

(72) Inventor: Toru Ishikawa, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/438,322

(22) Filed: Jun. 11, 2019

(65) Prior Publication Data

US 2019/0295627 A1    Sep. 26, 2019

Related U.S. Application Data

(63) Continuation of application No. 15/945,343, filed on Apr. 4, 2018, now Pat. No. 10,360,968, which is a continuation of application No. 15/089,346, filed on Apr. 1, 2016, now Pat. No. 9,959,921.

(51) Int. Cl.
  *G11C 11/40* (2006.01)
  *G11C 11/406* (2006.01)
  *G11C 11/4076* (2006.01)

(52) U.S. Cl.
  CPC .... *G11C 11/40615* (2013.01); *G11C 11/4076* (2013.01); *G11C 11/40626* (2013.01)

(58) Field of Classification Search
  None
  See application file for complete search history.

(56) References Cited

U.S. PATENT DOCUMENTS

| 5,295,109 A | * | 3/1994 | Nawaki | G11C 11/406 365/189.04 |
| 5,583,818 A | | 12/1996 | You et al. | |
| 5,586,287 A | | 12/1996 | Okumura et al. | |
| 6,108,252 A | * | 8/2000 | Park | G11C 29/50012 365/201 |

(Continued)

OTHER PUBLICATIONS

U.S. Appl. No. 15/089,346, entitled: "Apparatuses and Methods for Refresh Control", filed Apr. 1, 2016; pp. all.

(Continued)

*Primary Examiner* — Tan T. Nguyen
(74) *Attorney, Agent, or Firm* — Dorsey & Whitney LLP

(57) ABSTRACT

Apparatuses and methods of for refresh control of a semiconductor device are described. An example apparatus includes a command control circuit that provides a plurality of pulses on a first control signal in series responsive to a plurality of refresh commands issued in series; a signal generation circuit that produces a plurality of pulses on a second control signal in sequence; and a refresh control circuit that receives two or more of the plurality of pulses on the first control signal during a period of time between one pulse and a succeeding pulse of the plurality of pulses on the second control signal, disables refresh operations responsive to at least one of the two or more of the plurality of first control signal and executes a refresh operation responsive to remaining one or more pulses of the two or more of the plurality of pulses on the first control signal.

20 Claims, 9 Drawing Sheets

(56) References Cited

U.S. PATENT DOCUMENTS

| | | | |
|---|---|---|---|
| 6,285,610 B1 * | 9/2001 | Chun | G11C 29/50 365/200 |
| 6,813,210 B2 | 11/2004 | Okamoto et al. | |
| 6,842,815 B2 * | 1/2005 | Yim | G06F 13/4086 365/189.02 |
| 6,990,032 B2 | 1/2006 | Jang | |
| 7,447,110 B2 * | 11/2008 | Chae | G11C 7/1051 365/189.02 |
| 7,592,851 B2 * | 9/2009 | Chan | H03K 17/693 327/407 |
| 8,325,550 B2 | 12/2012 | Teramoto | |
| 8,531,905 B2 | 9/2013 | Song | |
| 9,007,862 B2 | 4/2015 | Ware et al. | |
| 9,959,921 B2 | 5/2018 | Ishikawa | |
| 10,360,968 B2 * | 7/2019 | Ishikawa | G11C 11/4076 |
| 2003/0063512 A1 | 4/2003 | Takahashi et al. | |
| 2003/0095442 A1 * | 5/2003 | Lee | G11C 7/1012 365/189.02 |
| 2003/0185079 A1 | 10/2003 | Takatsuka et al. | |
| 2004/0130958 A1 | 7/2004 | Takahashi et al. | |
| 2005/0152201 A1 * | 7/2005 | Takahashi | G11C 11/405 365/222 |
| 2005/0219930 A1 * | 10/2005 | Takahashi | G11C 11/406 365/222 |
| 2010/0074042 A1 * | 3/2010 | Fukuda | G11C 8/04 365/222 |
| 2011/0055671 A1 | 3/2011 | Kim et al. | |
| 2013/0114364 A1 * | 5/2013 | Sakakibara | G11C 11/40618 365/222 |
| 2014/0233324 A1 * | 8/2014 | Lee | G06F 1/08 365/189.02 |
| 2017/0287548 A1 | 10/2017 | Ishikawa | |
| 2018/0226121 A1 | 8/2018 | Ishikawa | |

OTHER PUBLICATIONS

U.S. Appl. No. 15/945,343 entitled 'Apparatuses and Methods for Refresh Control' filed Apr. 4, 2018, pp. all.

* cited by examiner

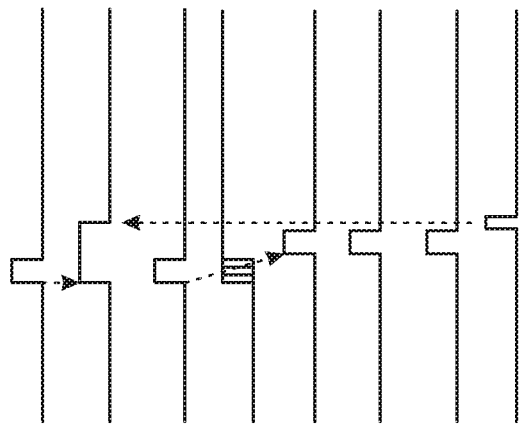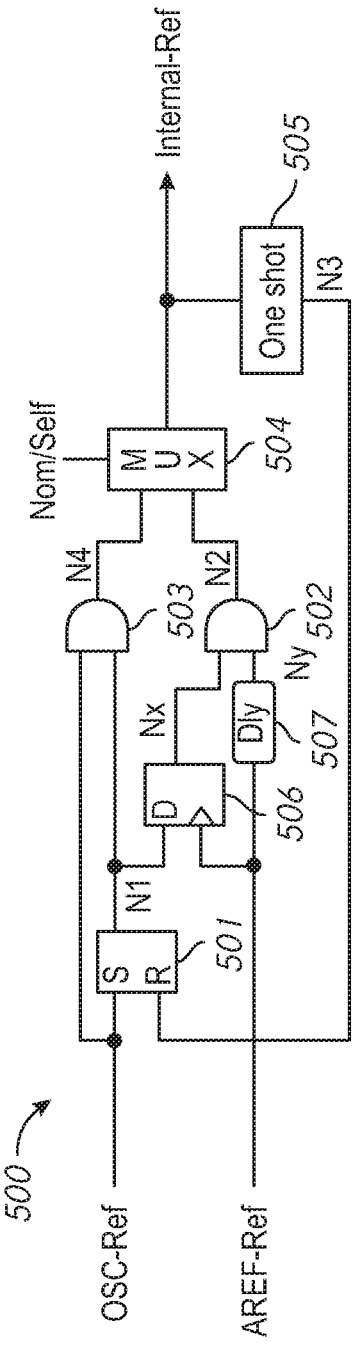
FIG. 5A
FIG. 5B

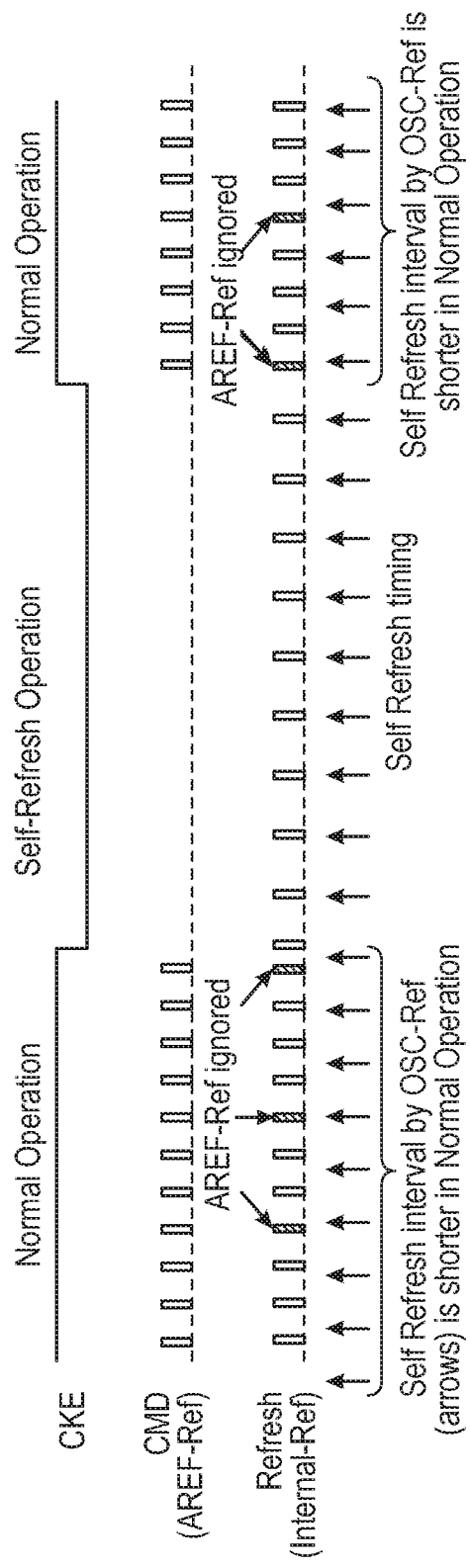
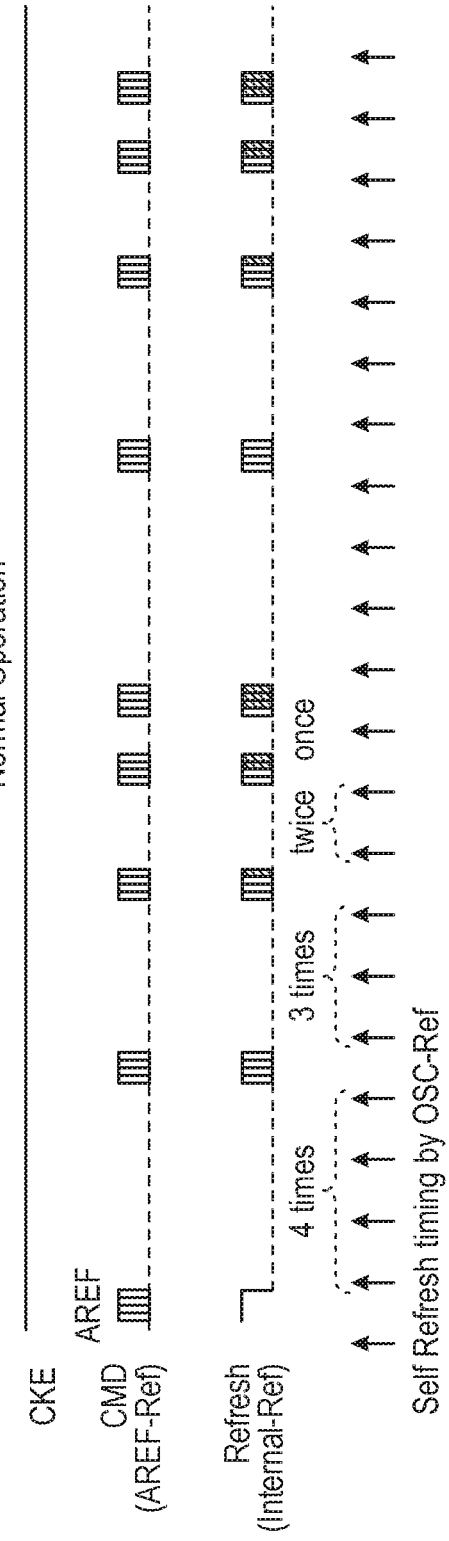
FIG. 8A
FIG. 8B

APPARATUSES AND METHODS FOR REFRESH CONTROL

CROSS-REFERENCE TO RELATED APPLICATIONS

This application is a continuation of U.S. patent application Ser. No. 15/945,343 filed Apr. 4, 2018 and issued as U.S. Pat. No. 10,360,968 on Jul. 23, 2019, which is a divisional of U.S. patent application Ser. No. 15/089,346, filed Apr. 1, 2016 and issued as U.S. Pat. No. 9,959,921 on May 1, 2018. The aforementioned applications, and issued patents, are incorporated by reference herein, in its entirety, and for any purposes.

BACKGROUND

High data reliability, high speed of memory access, reduced chip size and low power consumption are features that are demanded from semiconductor memory. In recent years, there has been an effort to further reduce power consumption.

In a semiconductor memory device, such as dynamic random access memory (DRAM), memory cells are refreshed in order to preserve the stored data. The semiconductor memory device typically has a normal operation mode and a self-refresh operation mode. The semiconductor memory device may conduct a refresh operation under the three conditions. First, the semiconductor memory device may conduct the refresh operation responsive to each auto-refresh (AREF) command. Second, the semiconductor memory device may conduct the refresh operation once at a self-refresh operation mode entry. Third, the semiconductor memory device may conduct the refresh operation responsive to refresh pulses provided by a signal generator, such as an oscillator.

In the normal operation mode, the semiconductor memory device is active. A clock enable signal CKE controls whether the semiconductor memory device is active (e.g., CKE having a logic high level). In the self-refresh operation mode, typically the semiconductor memory device is in a stand-by state. The clock enable signal CKE controls whether the semiconductor memory device is inactive (e.g., CKE having a logic low level). In order to reduce power consumption, an interval of executing the refresh operation in the self-refresh operation mode is longer than in the normal operation mode activated by the auto-refresh (AREF) command.

FIG. 1A is a timing diagram of signals in a normal operation mode and in a self-refresh operation mode in a semiconductor memory device. For example, auto refresh commands (AREF) are issued from a controller. Refresh operations are performed in accordance with the auto refresh commands when in the normal operation mode (e.g., while the clock enable signal CKE is at the logic high level). Intervals of the auto refresh commands are controlled by the controller. On the other hand, in the self-refresh operation mode (e.g., while the clock enable signal CKE is at the logic low level) the refresh operations are performed in accordance with a signal OSC, which is from a signal generation circuit, such as an oscillator, in the semiconductor memory device.

When the clock enable signal CKE becomes inactive (e.g., transition to the logic low level), the semiconductor memory device activates the oscillator to generate an internal refresh signal responsive to the signal OSC in the self-refresh operation mode, and refresh operations are performed in synchronism with the internal refresh signal. Intervals of the internal refresh signal are determined based on data retention ability of semiconductor memory device. Thus, the intervals of the internal refresh signal may be different, possibly longer than the intervals of the auto refresh commands (AREF). Refresh operation intervals of the auto-refresh command AREF in the normal operation mode tend to be shorter than necessary, resulting in more frequent refresh operation, and may cause higher power consumption. As described the above, the semiconductor memory device may be able to store data for a time longer than the interval of the auto-refresh command AREF, such as for the intervals of the signal OSC.

A refresh operation may be executed each time the semiconductor memory device enters a self-refresh operation mode. When the semiconductor memory device frequently switches between the normal operation mode and the self-refresh operation mode, the refresh operations from entering the self-refresh operation mode may also occur frequently. FIG. 1B is a timing diagram of signals in a normal operation mode and in a self-refresh operation mode in a semiconductor memory device. In this example, the semiconductor memory device switches between the normal operation mode and the self-refresh operation mode frequently, and as shown a refresh operation is performed each time the self-refresh operation mode is entered. If the period of the self-refresh operation mode is much shorter (e.g., a quarter of the interval of the signal OSC) than the time to provide the active signal of OSC, and if the active period of the normal operation is much shorter (e.g., a quarter of the interval of the signal OSC) than the time to receive the auto-refresh command AREF, refresh operations may be performed at each entry of the self-refresh operation mode, which may be twice as frequent as the interval of the active OSC.

Thus, the refresh operation intervals of each entry to the self-refresh operation mode tend to be more frequent than necessary and may cause unnecessary power consumption. For example, semiconductor memory devices used for mobile devices, such as Mobile DRAMs, are configured to quickly transit to the self-refresh operation mode when the semiconductor memory device does not receive read/write commands from the controller, and may experience the failure of the data retention or excess power consumption as described above due to frequent entries into the self-refresh operation mode.

BRIEF DESCRIPTION OF THE DRAWINGS

FIG. 5A is a timing diagram of signals of a refresh control circuit in a semiconductor device, in accordance with an embodiment of the present disclosure.

FIG. 5B is a circuit diagram of a refresh control circuit according to an embodiment of the present disclosure.

FIG. 8A is a timing diagram of signals in a normal operation mode and in a self-refresh operation mode in a semiconductor device, in accordance with an embodiment of the present disclosure.

FIG. 8B is a timing diagram of signals in a normal operation mode in a semiconductor device, in accordance with an embodiment of the present disclosure.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
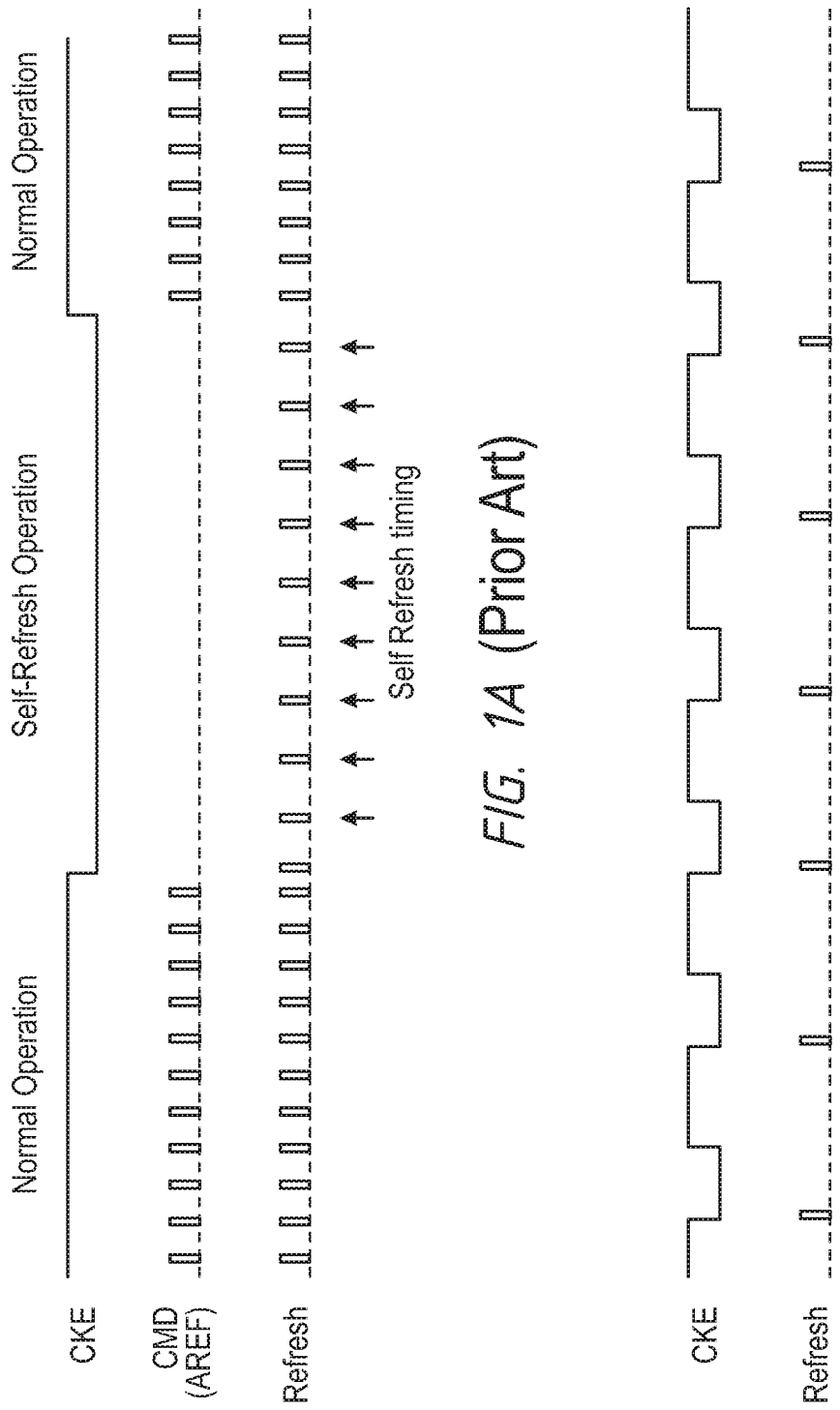
FIG. 1A is a timing diagram of signals in a normal operation mode and in a self-refresh operation mode in a semiconductor device.
FIG. 1B is a timing diagram of signals in a normal operation mode and in a self-refresh operation mode in a semiconductor device.
Figure 2:
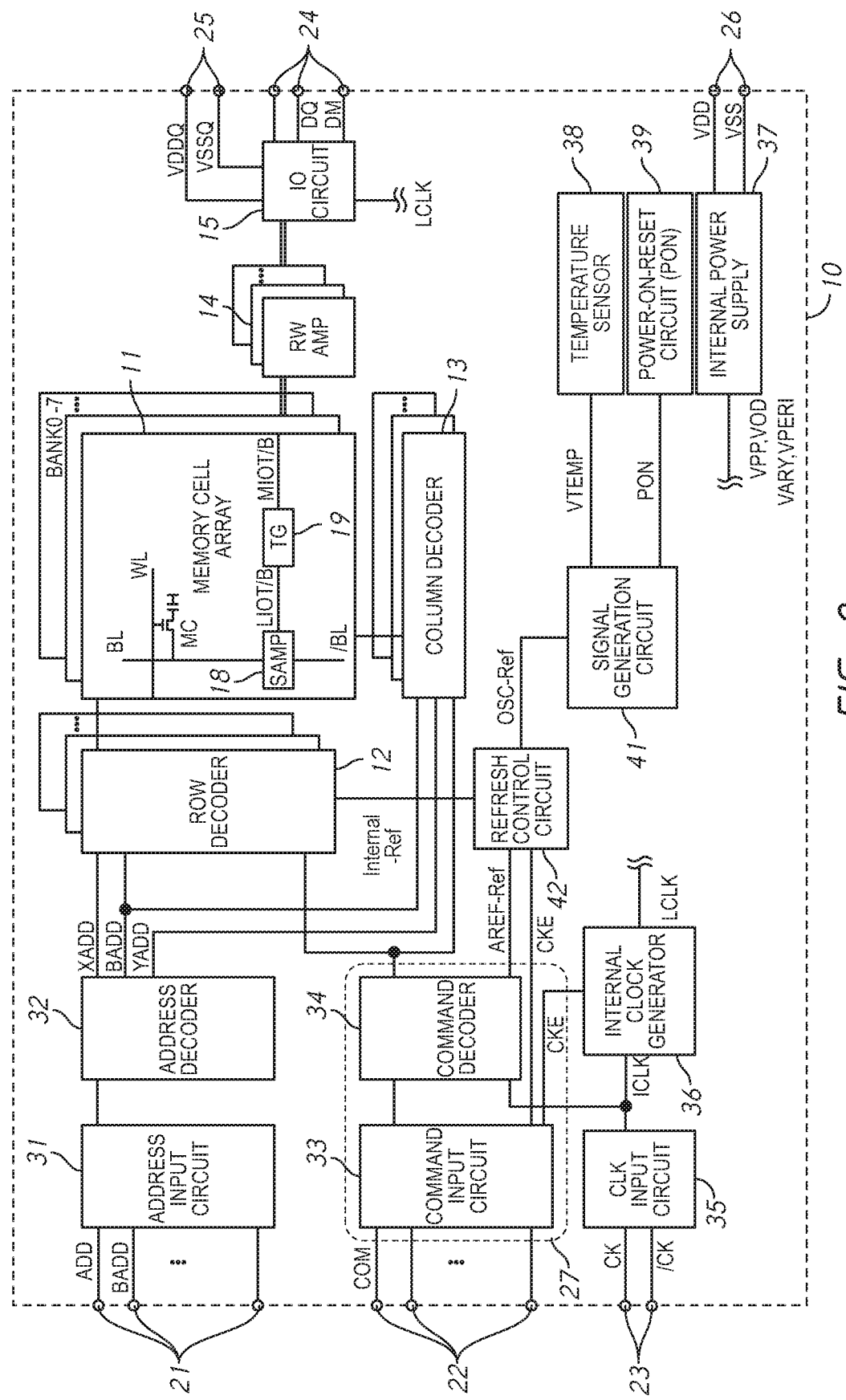
FIG. 2 is a block diagram of a semiconductor device including a refresh control circuit, in accordance with an embodiment of the present disclosure.

FIG. 2 is a block diagram of a semiconductor device in accordance with an embodiment of the present disclosure. The semiconductor device 10 may be a LPDDR4 SDRAM integrated into a single semiconductor chip, for example. As shown in FIG. 2, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers SAMP 18 are coupled to corresponding bit lines BL and connected to local I/O line pairs LIOT/B. Local 10 line pairs LIOT/B are connected to main IO line pairs MIOT/B via transfer gates TG 19 which are configured as switches.

Turning to the explanation of a plurality of external terminals included in the semiconductor device 10, the plurality of external terminals includes address terminals 21, command terminals 22, clock terminals 23, data terminals 24 and power supply terminals 25 and 26. The address terminals 21 are supplied with an address signal ADD and a bank address signal BADD. The address signal ADD and the hank address signal BAUD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12, and the column decoder 13.

The command terminals 22 are supplied with a command signal COM to a command control circuit 27. The command control circuit 27 may include a command input circuit 33 and a command decoder 34. The command signal COM may include one or more separate signals. The command signal COM input to the command terminals 22 is provided to the command decoder 34 via the command input circuit 33. The command decoder 34 decodes the command signal COM to generate various control signals. For example, the control signals may include a row command signal to select a word line and a column command signal, such as a read command or a write command, to select a bit line, and a AREF-Ref signal, which is a first control signal, provided to a refresh control circuit 42.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 14 and an input/output circuit 15. Similarly, when the write command is issued and a row address and a column address are timely supplied with the write command, and then write data DQ is supplied to the data terminals 24, the write data DQ is supplied via the input/output circuit 15 and the read/write amplifier 14 to the memory cell array 11 and written in the memory cell MC designated by the row address and the column address. The input/output circuit 15 may include input buffers, according to one embodiment.

The clock terminals 23 are supplied with external clock signals CK and/CK, respectively. These external clock signals CK and/CK are complementary to each other and are supplied to a clock input circuit 35. The clock input circuit 35 receives the external clock signals CK and/CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 15 and is used as a timing signal for determining an output timing of the read data DQ. The internal clock signal ICLK is also supplied to a command decoder 34 for decoding the command signal COM to generate various control signals.

The power supply terminals 25 are supplied with power supply potentials VDDQ and VSSQ. These power supply potentials VDDQ and VSSQ are supplied to the input/output circuit 15. The power supply potentials VDDQ and VSSQ may be the same potentials as the power supply potentials VDD and VSS that are supplied to the power supply terminals 25, respectively. However, the dedicated power supply potentials VDDQ and VSSQ may be used for the input/output circuit 15 so that power supply noise generated by the input/output circuit 15 does not propagate to the other circuit blocks. The power supply terminals 26 are supplied with power supply potentials VDD and VSS. These power supply potentials VDD and VSS are supplied to an internal power supply circuit 37. The internal power supply circuit 37 generates various internal potentials VPP, VOD, VARY, VPERI, and the like based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. A power-on-reset circuit (PON) 39 provides a PON signal when the internal power supply circuit 37 becomes capable to supply a sufficient level of internal voltage in a power-on sequence. A temperature sensor 38 senses a temperature of the semiconductor device and provides a VTEMP signal, which is indicative of a temperature of the semiconductor device. For example, a voltage level of the VTEMP signal may become higher if the temperature of the semiconductor device becomes higher.

A signal generation circuit 41 may be an oscillator that provides an OSC-Ref signal, which is a second control signal, responsive to the PON signal. The signal generation circuit 41 may control intervals of OSC-Ref responsive to the VTEMP signal. For example, the signal generation circuit 41 may decrease the intervals of activation of the OSC-Ref signal for more frequent refresh operations when the temperature is higher, responsive to the VTEMP signal indicating a higher temperature. The signal generation circuit 41 may also increase the intervals of activation of the OSC-Ref signal for less frequent refresh operations, responsive to the VTEMP signal indicating that the temperature is lower. A refresh control circuit 42 may receive the AREF-Ref signal from the command decoder 34, the clock enable signal CKE from the command input circuit 33, and the OSC-Ref signal from the signal generation circuit 41. The refresh control circuit 42 provides an Internal-Ref signal for controlling refresh operations. The row decoder 12 receives the Internal-Ref signal and increments a row address for refresh operations responsive to the Internal-Ref signal.

Figure 3A:
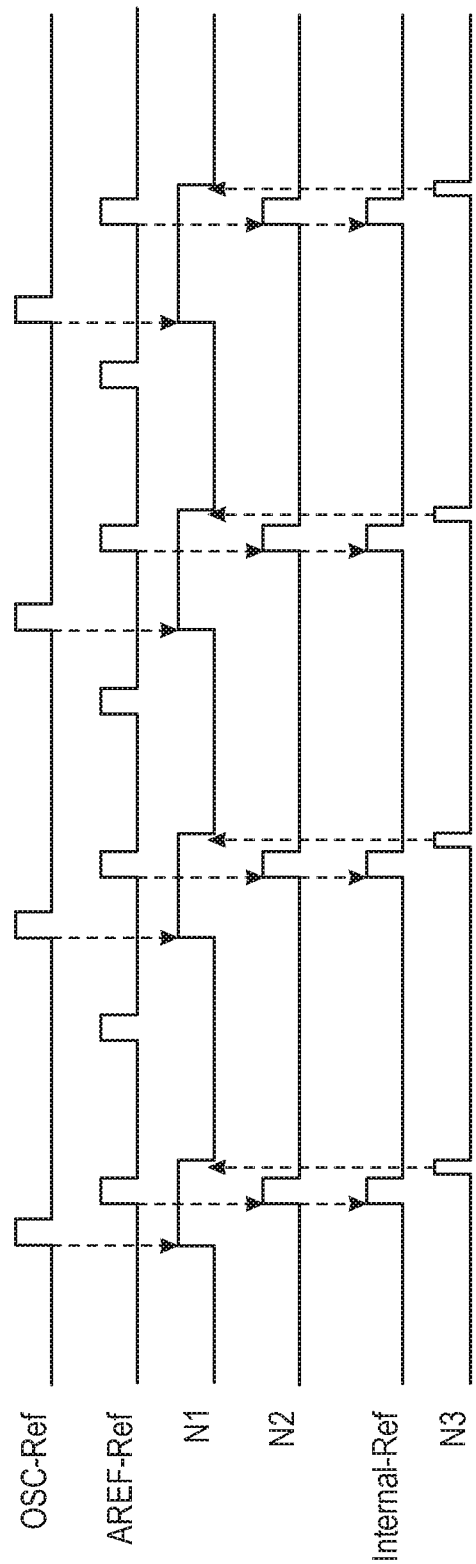
FIG. 3A is a timing diagram of signals of a refresh control circuit in a semiconductor device, in accordance with an embodiment of the present disclosure.
Figure 3B:
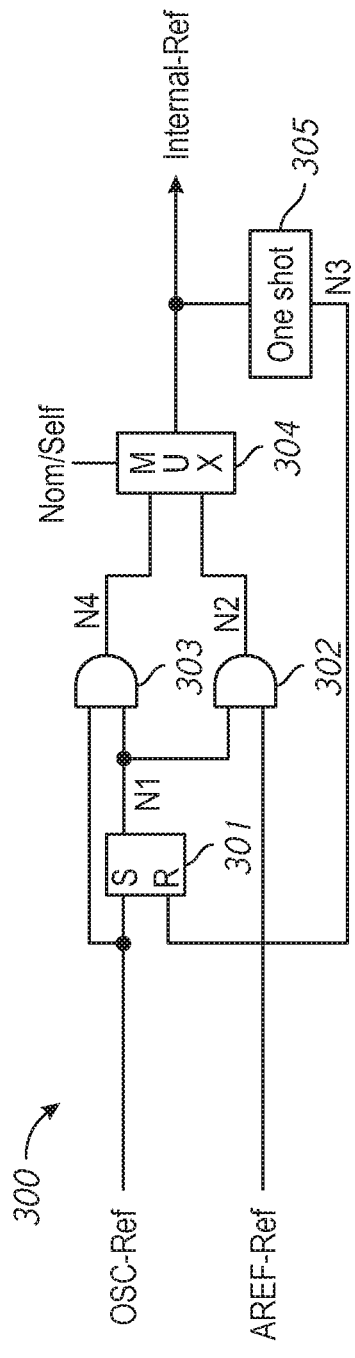
FIG. 3B is a circuit diagram of a refresh control circuit according to an embodiment of the present disclosure.

FIG. 3A is a timing diagram of signals of a refresh control circuit in a semiconductor device, in accordance with an embodiment of the present disclosure. FIG. 3B is a circuit diagram of the refresh control circuit according to an embodiment of the present disclosure. Refresh control circuit 300 may include a set-reset (SR) latch circuit 301. The SR-latch circuit 301 may receive the OSC-Ref signal at a set input (S) and sets a latch signal of a node N1 to a logic high level. An AND circuit 302 receives the AREF-Ref signal and the latch signal on the node N1, and may further provide a signal on a node N2. The signal on node N2 is set to a logic high level when both the latch signal on the node N1 and the AREF-Ref signal are set to the logic high level. An AND circuit 303 receives the OSC-Ref signal and the latch signal on the node N1, and provides a signal on a node N4 which is set to a logic high level when both the latch signal on the node N1 and the OSC-Ref signal are set to the logic high level. A multiplexer MUX 304 provides either the signal on the node N2 or the signal on the node N4 as the Internal-Ref signal, responsive to a signal "Nom/Self" indicative of a normal operation mode or a self-refresh operation mode, respectively. For example, the signal "Nom/Self" may correspond to a clock enable signal CKE. A one shot pulse generator 305 provides a one shot pulse signal responsive to the Internal-Ref signal on a node N3. The one shot pulse signal on the node N3 is received at a reset input (R) of the SR latch circuit 301 which resets the latch signal on the node N1 to a logic low level. The latch signal on the node N1 maintains the logic low level until the OSC-Ref signal is activated, regardless of activation of the AREF-Ref signal.

Figure 4A:
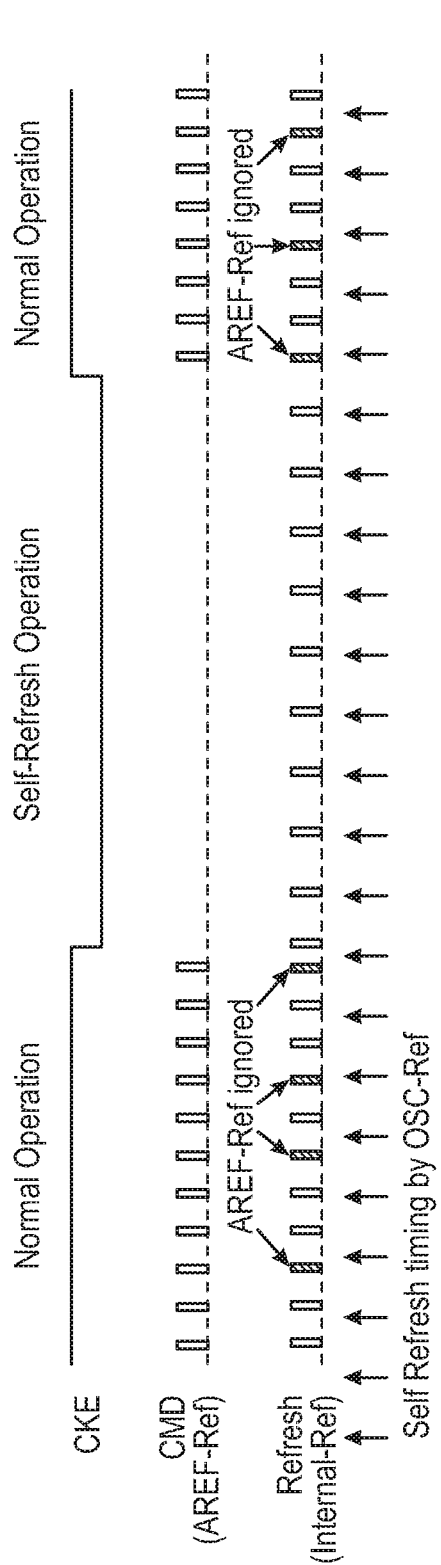
FIG. 4A is a timing diagram of signals in a normal operation mode and in a self-refresh operation mode in a semiconductor device, in accordance with an embodiment of the present disclosure.

FIG. 4A is a timing diagram of signals in a normal operation mode and in a self-refresh operation mode in a semiconductor device, in accordance with an embodiment of the present disclosure. The OSC-Ref signal is provided through the normal operation mode and the self-refresh operation mode by the signal generation circuit 41 which may partly be responsive to the temperature of the semiconductor device. The intervals of pulses corresponding to activation timings of the OSC-Ref signal may be relatively constant as shown by the upward pointing arrow lines. The AREF-Ref signal resulting from an auto-refresh command may be ignored and the Internal-Ref signal remains inactive (e.g., the logic low level) regardless of the AREF-Ref signal, if the Internal-Ref signal has already been activated by the AREF-Ref signal after the last activation of the OSC-Ref signal, as represented by dark "Refresh" pulses. The refresh intervals in the normal operation mode become substantially the same as the refresh intervals in the self-refresh operation mode. Because the semiconductor device such as DRAM executes any operation based on commands with higher priority than the refresh operation in the normal operation mode, the semiconductor device is not able to execute refresh operation responsive to the OSC-Ref signal from the signal generation circuit 41. The refresh control circuit 300 provides refresh timings responsive to the AREF-Ref signal originated from the auto refresh command, while keeping the refresh intervals substantially the same as the refresh intervals of the OSC-Ref signal, even in the normal operation mode.

Figure 4B:
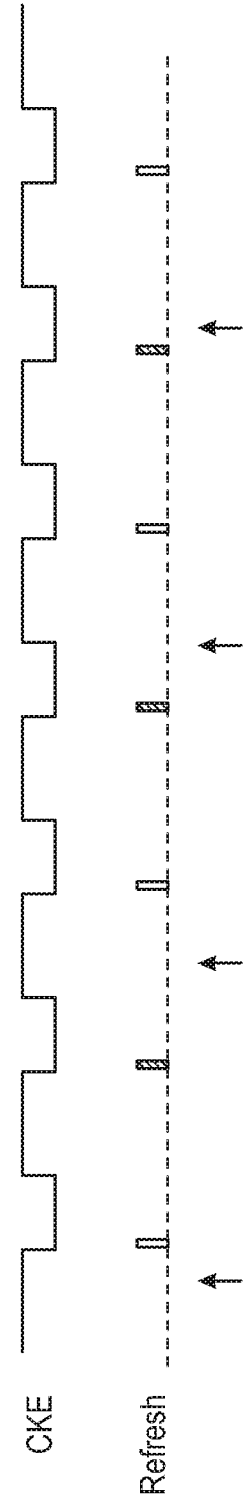
FIG. 4B is a timing diagram of signals in a normal operation mode and in a self-refresh operation mode in a semiconductor device, in accordance with an embodiment of the present disclosure.

FIG. 4B is a timing diagram of signals in a normal operation mode and in a self-refresh operation mode in a semiconductor device, in accordance with an embodiment of the present disclosure. When the semiconductor device frequently switches between the normal operation mode and the self-refresh operation mode, an auto-refresh command provided at an entry to the self-refresh operation mode may be ignored (represented by dark "Refresh" pulses), if a refresh operation has already been executed after the last activation of the OSC-Ref signal as represented by the upward pointing arrow lines.

FIG. 5A is a timing diagram of signals of a refresh control circuit in a semiconductor device, in accordance with an embodiment of the present disclosure. FIG. 5B is a circuit diagram of a refresh control circuit according to an embodiment of the present disclosure. The refresh control circuit 500 may include a set-reset (SR) latch circuit 501, AND circuits 502 and 503, a multiplexer MUX 504 and a one shot pulse generator 505 that function similarly as the SR latch circuit 301, the AND circuits 302 and 303, the multiplexer MUX 304 and the one shot pulse generator 305 in FIG. 3B, consequently, description for the SR latch circuit 501, the AND circuits 502 and 503, the multiplexer MUX 504 and the one-shot pulse generator circuit 505 will not be repeated. When a clock enable signal CKE is inactive (e.g., a logic low level), the multiplexer 504 provides an output signal of the AND circuit 503 as the Internal-Ref signal. When the clock enable signal CKE is active (e.g., a logic high level), the multiplexer 504 provides an output signal of the AND circuit 502 as the Internal-Ref signal.

The refresh control circuit 500 further comprises a data (D) flip-flop circuit 506 and a delay circuit 507. The D flip-flop circuit 506 may receive an AREF-Ref signal including two or more of the plurality of pulses at a clock input (C). The D flip-flop circuit 506 may receive a latch signal on a node N1 from the SR latch circuit 501 at a data input (D) and each of the plurality of pulses of the AREF Ref signal at a clock input. The D circuit 506 may be set to a first state responsive to the latch signal in the first state upon receipt of one of the plurality of pulses of the AREF Ref signal. The D flip-flop circuit 506 may further provide an internal signal of one of the first state and the second state on a node Nx as one of input signals to the AND circuit 502. The AREF-Ref signal may also be provided to the delay circuit 507 and the delayed AREF-Ref signal is provided on a node Ny. The delay provided by the delay circuit may correspond to a period while the internal signal of the node Nx from the D flip-flop circuit 506 may be in a metastable state. The AND circuit 502 receives the internal signal on the node Nx and the delayed AREF-Ref signal on the node Ny.

As shown in FIG. 5A, the signal on the node N2 can be activated using a result of arbitration responsive to the internal signal from the D flip-flop circuit 506 on the node Nx and the delayed AREF-Ref signal on the node Ny which provides a detection timing of a stable activation of the internal signal on the node Nx instead of the AREF-Ref signal. Even if the internal signal Nx becomes metastable due to internal metastability of the D flip-flop circuit 506 responsive to the OSC-Ref signal and the latch signal on the node N1, a level of the internal signal Nx is provided based on active timings of the delayed AREF-Ref signal Ny instead of the AREF-Ref signal, and a stable level of the internal signal Nx is provided as the signal on the node N2.

Figure 6:
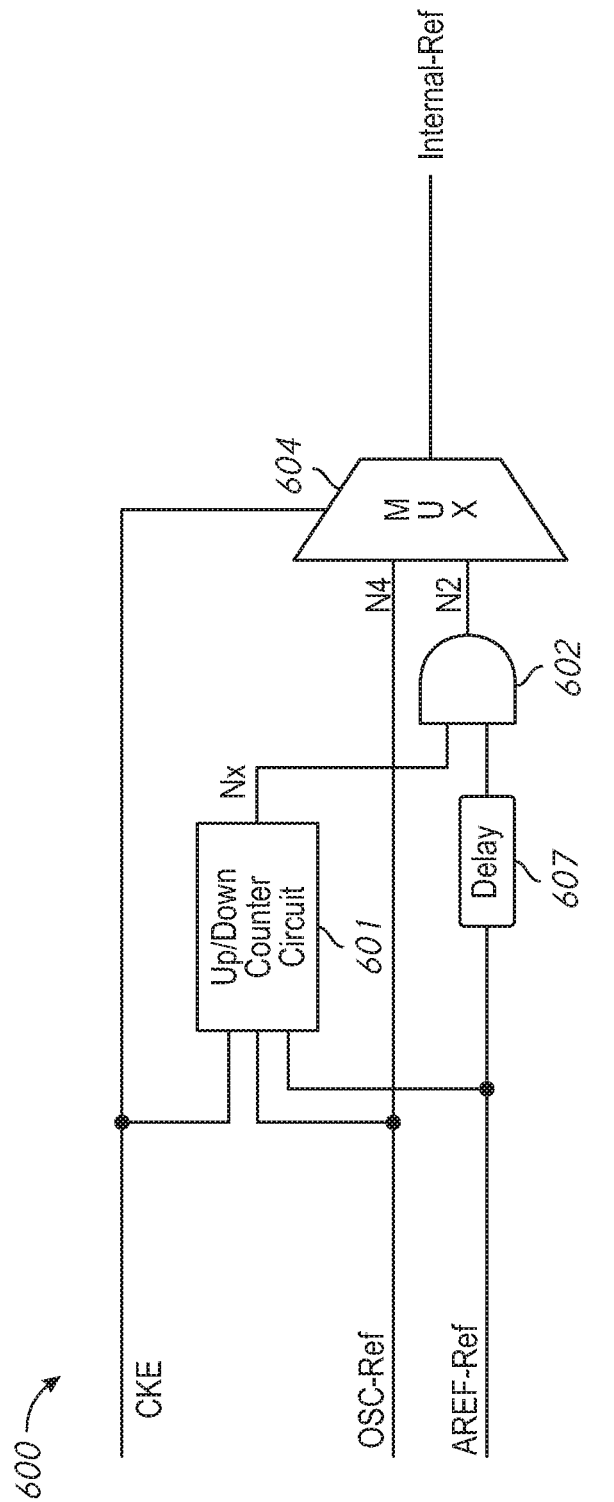
FIG. 6 is a circuit diagram of a refresh control circuit according to an embodiment of the present disclosure.

In some embodiments, an AREF-Ref signal may be activated repeatedly, due to frequently issued auto-refresh commands or a plurality of refresh commands consecutively (e.g., in series) with a frequency reflected by the OSC-Ref signal. FIG. 6 is a circuit diagram of a refresh control circuit according to an embodiment of the present disclosure. For example, the refresh control circuit 600 may include an AND circuit 602, a multiplexer MUX 604, and a delay circuit 607 that function similarly as the AND circuits 502, the multiplexer MUX 504, and the delay circuit 507 in FIG. 5B, consequently, description for the AND circuit 602, the multiplexer MUX 604, and the delay circuit 607 will not be repeated. When a clock enable signal CKE is inactive (e.g., a logic low level), the multiplexer 604 provides the OSC-Ref signal as the Internal-Ref signal. When the clock enable signal CKE is active (e.g., a logic high level), the multiplexer 604 provides an output signal of the AND circuit 602 as the Internal-Ref signal.

The refresh control circuit 600 may further comprise an up-down counter 601. For example, the up-down counter 601 receives the OSC-Ref signal, the AREF-Ref signal and the clock enable signal CKE as an enable signal. A count stored in the up-down counter 601 may be reset when the enable signal is activated, and the up-down counter 601 increments the count responsive to an active pulse of the OSC-Ref signal and decrements the count responsive to an active pulse of the AREF-Ref signal. The up-down counter 601 provides an output signal that is active (e.g., a logic high level) when the count is equal to or more than "1", while the clock enable signal CKE is active (e.g., the logic high level). The up-down counter 601 provide the output signal that is inactive (e.g., the logic low level) when the count stored in the up-down counter is zero, while the clock enable signal CKE is active. Thus, the up-down counter 601 may inhibit propagating the active AREF-Ref signal on the output signal while the count is zero. The output signal of the up-down counter 601 is provided to one of two input nodes of the AND circuit 602. Furthermore, the up-down counter 601 may include an arbiter portion in order to avoid a metastable state caused by simultaneous pulses of the OSC-Ref signal and the AREF-Ref signal. The delay circuit 607 may be provided for holding the AREF-Ref signal while waiting for a stable output from the up-down counter 601 even if a slight metastable may be caused in the up-down counter 601.

Figure 7A:
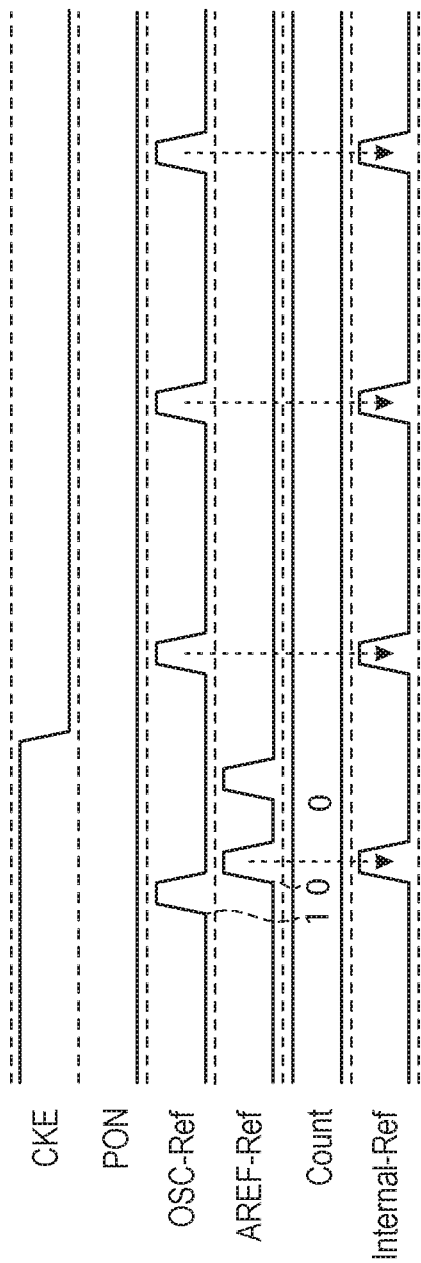
FIG. 7A is a timing diagram of signals of a refresh control circuit in a semiconductor device, in accordance with an embodiment of the present disclosure.

FIG. 7A is a timing diagram of signals of a refresh control circuit in a semiconductor device, in accordance with an embodiment of the present disclosure. When the clock enable signal CKE is inactive, the Internal-Ref signal propagates active pulses on the OSC-Ref signal.

Figure 7B:
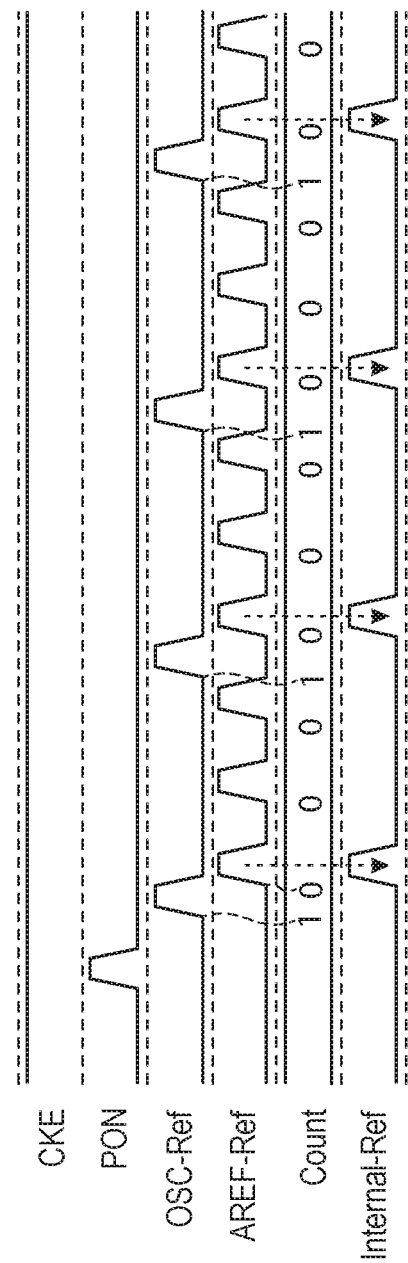
FIG. 7B is a timing diagram of signals of a refresh control circuit in a semiconductor device, in accordance with an embodiment of the present disclosure.

FIG. 7B is a timing diagram of signals of a refresh control circuit in a semiconductor device, in accordance with an embodiment of the present disclosure. After the PON signal provides a pulse for power-on, the OSC-Ref signal is provided. When the OSC-Ref signal provides one active pulse, the counter may increment the count to "1". When the AREF-Ref signal provides one active pulse, the Internal-Ref signal provides one active pulse based on the count "1", and the counter decrements the count responsive to the AREF-Ref signal. The count remains constant at "0" until a next pulse is provided by the OSC-Ref signal. For example, the AND circuit 602 of FIG. 6 may disable the second and third pulses on the AREF-Ref signal to be provided on the node N2 responsive to the internal signal on the node Nx. Thus, the first pulse AREF-Ref alone may be propagated on the Internal-Ref signal. Thus, the next two active pulses provided by the AREF-Ref signal may not be propagated to the Internal-Ref signal, responsive to the count that is "0".

Figure 7C:
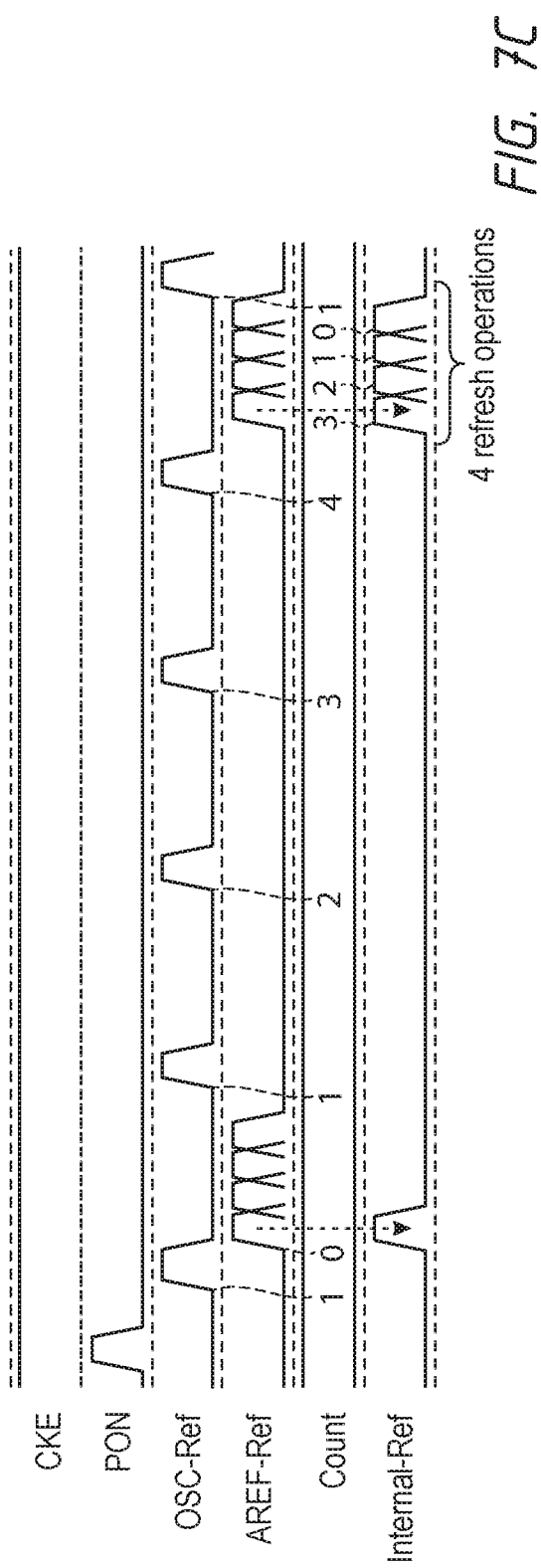
FIG. 7C is a timing diagram of signals of a refresh control circuit in a semiconductor device, in accordance with an embodiment of the present disclosure.

The refresh control circuit described above may be used for "Burst refresh operation" when pulses on the AREF-Ref signal are issued in clusters. FIG. 7C is a timing diagram of signals of a refresh control circuit in a semiconductor device, in accordance with an embodiment of the present disclosure. In this example, an auto-refresh command instructing consecutive auto refresh operations may be provided and the AREF-Ref signal reflects the command. After the PON signal provides a pulse for power-on, the OSC-Ref signal is provided. A first pulse of the OSC-Ref signal increments the count to "1" and the Internal-Ref signal provides one pulse at a first time when the AREF-Ref signal provides consecutive four active pulses. The counter decrements the count to "0" responsive to the pulses of the AREF-Ref signal. Thereafter, pulses of the OSC-Ref signal increments the count to "1", "2", "3", "4" after the consecutive four active pulses of the AREF-Ref In this example, a next auto-refresh command is provided after the count becomes "4". Thus, four pulses to instruct four refresh operations may be provided on the Internal-Ref signal, responsive to the AREF-Ref signal being active responsive to the next auto-refresh command. In this example, the number of the consecutive active pulses of the AREF-Ref signal is four, however, other numbers of active pulses may be used instead.

Figure 7D:
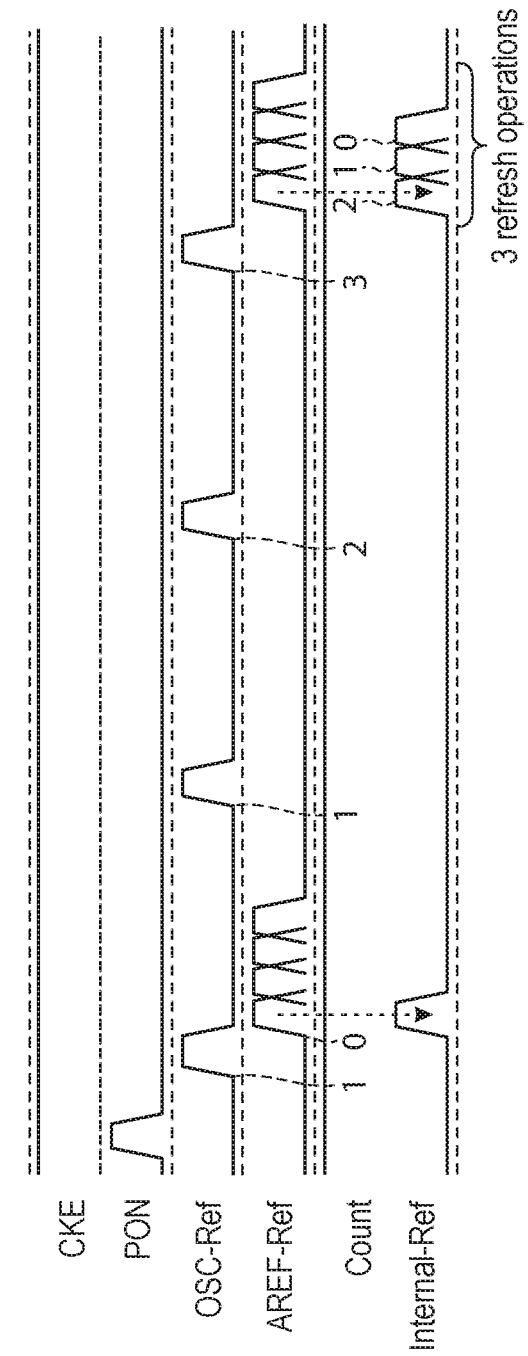
FIG. 7D is a timing diagram of signals of a refresh control circuit in a semiconductor device, in accordance with an embodiment of the present disclosure.

FIG. 7D is a timing diagram of signals of a refresh control circuit in a semiconductor device, in accordance with an embodiment of the present disclosure. Similar to FIG. 7C, following the decrement of the counter to "0" responsive to the pulses of the AREF-Ref signal, pulses of the OSC-Ref signal increments the count to "2", "2", "3", after the consecutive four active pulses of the AREF-Ref signal. In this example, a next auto-refresh command is provided after the count becomes "3". Thus, three pulses to instruct three refresh operations may be provided on the Internal-Ref signal, when the AREF-Ref signal becomes active responsive to the next auto-refresh command, regardless of the number of consecutive pulses in the AREF-Ref signal that is four. A fourth pulse on AREF-Ref is disabled because the count was three. In this example, the number of the consecutive active pulses in the AREF-Ref signal is four, however, other numbers of active pulses may be used instead.

FIG. 8A is a timing diagram of signals in a normal operation mode in a semiconductor device, in accordance with an embodiment of the present disclosure. The OSC-Ref signal is provided through the normal operation mode when the clock enable signal CKE is active (e.g., CKE having a logic high level) and the self-refresh operation mode when the clock enable signal CKE is inactive (e.g., CKE having a logic low level). Any refresh timing based on the AREF-Ref signal originated from an auto-refresh command may be ignored and activation of the Internal-Ref signal may be disabled, if the Internal-Ref signal has already been activated by the AREF-Ref signal after the last activation of the OSC-Ref signal, as shown by dark "Refresh" pulses. For example, the Internal-Ref signal may not be activated if there is no OSC-Ref signal activation between the last AREF-Ref activation and the current AREF-Ref activation as shown in FIG. 7A. The intervals of activation timings of the OSC-Ref signal may be fairly constant as represented by arrow lines in FIG. 8A for each of the normal operation and the self-refresh operation, and the intervals in the normal operation may be shorter than the intervals in the self-refresh operation. It is possible to design the shorter intervals for the normal operation so that refresh intervals may not become too long depending on patterns of pulses of the AREF-Ref signal. The refresh control circuit 600 may be used to provide refresh timings responsive to the AREF-Ref signal originated from the auto refresh command, while keeping the refresh intervals substantially the same as the refresh intervals of the OSC-Ref signal, even in the normal operation mode.

In another example, the Internal-Ref signal may be activated for a number of times consecutively as shown in FIGS. 7C and 7D. FIG. 8B is a timing diagram of signals in a normal operation mode in a semiconductor device, in accordance with an embodiment of the present disclosure. The OSC-Ref signal may be constantly provided through the normal operation mode as represented by arrow lines in FIG. 8B for the normal operation. In this example, an auto-refresh command instructing consecutive auto refresh operations may be provided and the AREF-Ref signal reflects the command. Pulses of the OSC-Ref signal increments the count to "1", "2", "3" and "4" after consecutive four active pulses. In this example, next auto-refresh command is provided after the count becomes "4". Thus, four pulses to instruct four refresh operations may be provided on the Internal-Ref signal, when the AREF-Ref signal becomes active responsive to the next auto-refresh command, regardless of the number of consecutive pulses in the AREF-Ref signal that is four. Next, pulses of the OSC-Ref signal increments the count to "1", "2", "3", after consecutive four active pulses of the AREF-Ref signal. In this example, next auto-refresh command is provided after the count becomes "3". A fourth pulse on the AREF-Ref signal is disabled because the count was three. Next, pulses of the OSC-Ref signal increments the count to "1", "2", after consecutive four active pulses of the AREF-Ref signal. In this example, next auto-refresh command is provided after the count becomes "2". Third and fourth pulses on the AREF-Ref signal are disabled because the count was two. Next, pulses of the USC-Ref signal increments the count to "1", after consecutive four active pulses of the AREF-Ref signal. In this example, next auto-refresh command is provided after the count becomes "1". Second, third and fourth pulses on the AREF-Ref signal are disabled because the count was one. The refresh control circuit 600 may be used to provide refresh timings responsive to pulses in series of the AREF-Ref signal provided by the command control circuit originated from the plurality of auto refresh commands in series.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
    a refresh control circuit configured to receive a first control signal and a second control signal, wherein the refresh control circuit comprises:
        a first circuit configured to provide a first signal responsive to the first control signal; and
        a multiplexer configured to provide either the first signal or the second control signal as a third signal responsive to a clock enable signal.

2. The apparatus of claim 1, further comprising:
    a latch circuit configured to provide a latch signal responsive to the second control signal; and
    a second circuit configured to provide a second signal responsive to the second control signal and the latch signal of the latch circuit, and wherein the multiplexer is configured to receive the second signal as the second control signal and further configured to provide the first signal or the second signal as the third signal responsive to the clock enable signal.

3. The apparatus of claim 2, wherein the refresh control circuit further comprises a one shot pulse generator configured to provide a one shot pulse signal responsive to the third signal, and
    wherein the latch circuit is configured to receive the one shot pulse signal.

4. The apparatus of claim 3, wherein the latch circuit is a set-reset latch circuit comprising:
    a set input configured to receive the second control signal; and
    a reset input configured to receive the one shot pulse signal, wherein the latch circuit is configured to set the latch signal responsive to the second control signal, and further configured to reset the latch signal responsive to the one shot pulse signal, wherein the first circuit is an AND gate configured to receive the first control signal and the latch signal, wherein the second circuit is an AND gate configured to receive the latch signal and the second control signal, and wherein the multiplexer is configured to receive the first signal and the second signal and further configured to provide the first signal as the third signal when the clock enable signal is active and to provide the second signal as the third signal when the clock enable signal is inactive.

5. The apparatus of claim 4, wherein the third signal remains inactive regardless of the first control signal, when the third signal has already been activated by the first control signal after last activation of the second control signal.

6. The apparatus of claim 3, wherein the refresh control circuit further comprises:
a flip-flop circuit configured to receive the first control signal and the latch signal of the latch circuit and further configured to provide an internal signal; and
a delay circuit configured to provide a delayed first control signal responsive to the first control signal, wherein the first circuit is configured to receive the delayed first control signal and the internal signal.

7. The apparatus of claim 6, wherein the flip-flop circuit is a D flip-flop circuit comprising:
a data input configured to receive the latch signal; and
a clock input configured to receive the first control signal including two or more pulses, wherein the delay circuit is configured to provide a delay which corresponds to a predetermined period related to a state of the internal signal of the flip-flop circuit.

8. The apparatus of claim 1, wherein the refresh control circuit further comprises:
an up-down counter circuit configured to provide a third control signal responsive to the first control signal; the second control signal and the clock enable signal; and
a delay circuit configured to provide a delayed first control signal responsive to the first control signal, wherein the first circuit is configured to receive the third control signal and the delayed first control signal, and wherein the multiplexer is configured to receive the first signal and the second control signal and further configured to provide the first signal or the second control signal as the third signal responsive to the clock enable signal.

9. The apparatus of claim 8, wherein the up-down counter circuit is configured to store a count and further configured to increment the count responsive to an active pulse of the second control signal and further configured to decrement the count responsive to an active pulse of the first control signal while the clock enable signal is active, and wherein the up-down counter circuit is configured to provide the third control signal being active when the count is equal to or more than one and further configured to provide the third control signal being inactive when the count is zero.

10. The apparatus of claim 1, further comprising:
a command control circuit configured to provide the first control signal including a pulse responsive to a refresh command;
a signal generation circuit configured to provide pulses on the second control signal at predetermined intervals; and
a row decoder configured to perform a refresh operation responsive to the third signal.

11. An apparatus comprising:
a refresh control circuit configured to receive a first control signal and a second control signal, wherein the refresh control circuit comprises:
a first circuit configured to provide a first signal based, at least in part, on the first control signal and an input signal, wherein the first circuit is configured to ignore the first control signal to provide the first signal responsive to an inactive input signal; and
a multiplexer configured to provide a third signal based, at least in part, on either the first signal or the second control signal responsive to a clock enable signal.

12. The apparatus of claim 11, further comprising a second circuit configured to provide a second signal based, at least in part, on the second control signal,
wherein the multiplexer is further configured to receive the first and second signals from the first and second circuits, respectively; and provide the third signal based, at least in part, on the received first and second signals.

13. The apparatus of claim 12, further comprising a third circuit configured to provide the input signal to the first circuit based, at least in part; on the second control signal.

14. The apparatus of claim 13, wherein the third circuit comprises a latch circuit configured to provide an active input signal when set by the second control signal and to further provide the input signal to the second circuit.

15. The apparatus of claim 14, wherein the latch circuit is further configured to be reset based, at least in part, on the third signal.

16. The apparatus of claim 13, wherein the third circuit comprises a flip-flop circuit configured to provide the input signal to the first circuit based on a latch signal received responsive to the first control signal.

17. The apparatus of claim 11, wherein the second circuit comprises a counter circuit configured to provide the input signal to the first circuit based, at least in part, on the first and second control signals, and the clock enable signal.

18. An apparatus comprising:
a refresh control circuit comprising:
a first circuit configured to provide a first signal responsive to a first control signal;
a second circuit configured to provide a second signal responsive to a second control signal; and
a multiplexer configured to receive the first signal and the second signal and provide a third signal,
wherein the third signal remains inactive regardless of the first control signal, when the third signal has already been activated by the first control signal after last activation of the second control signal.

19. The apparatus of claim 18, further comprising:
a latch circuit configured to provide a latch signal responsive to the second control signal.

20. The apparatus of claim 19, wherein the latch circuit is configured to set the latch signal responsive to the second control signal, and
wherein the first circuit is an AND gate configured to receive the first control signal and the latch signal.

* * * * *